United States Patent
Hsiao

(10) Patent No.: US 6,788,549 B2
(45) Date of Patent: Sep. 7, 2004

(54) GROUNDING STRUCTURE FOR A CARD READER

(75) Inventor: Wen-Hsiang Hsiao, Taipei (TW)

(73) Assignee: WEM Technology Inc., Taipei (TW)

( * ) Notice: Subject to any disclaimer, the term of this patent is extended or adjusted under 35 U.S.C. 154(b) by 0 days.

(21) Appl. No.: 10/358,354

(22) Filed: Feb. 5, 2003

(65) Prior Publication Data
US 2004/0150971 A1 Aug. 5, 2004

(51) Int. Cl.[7] .................................................. H05K 7/14
(52) U.S. Cl. ....................................... 361/799; 361/800
(58) Field of Search ................................ 361/765, 753, 361/783, 796, 799, 800

(56) References Cited
U.S. PATENT DOCUMENTS 5,908,333 A * 6/1999 Perino et al. ................ 439/631
6,565,267 B2 * 5/2003 Abe et al. ...................... 385/88

* cited by examiner

Primary Examiner—David Martin
Assistant Examiner—Thanh S. Phan
(74) Attorney, Agent, or Firm—Bacon & Thomas, PLLC

(57) ABSTRACT

The card reader includes a circuit board in a housing as a principal unit, the circuit board is provided with a circuit connector to connect with a main circuit of an electric equipment. The circuit board is provided on the front surface thereof at least with an insertion slot for insertion of a memory card; and an integrated circuit is connected between the insertion slot and the circuit connector to control the operation of the entire card reader, and further to form the connection between the memory card and the main circuit. The structure is characterized by that, the structure is provided in the section between the integrated circuit and the housing with a plurality of electrically conductive areas formed of electrically conductive material; the electrically conductive areas are connected with the grounding line of the circuit board to form a function of grounding to scatter electric waves, so that the integrated circuit can avoid damaging and destroying by piercing of external electric waves.

2 Claims, 4 Drawing Sheets

GROUNDING STRUCTURE FOR A CARD READER

BACKGROUND OF THE INVENTION

1. Field of the Invention

The present invention is related to a grounding structure of a card reader, and especially to such a structure capable of effectively avoiding the integrated circuit of the card reader from damage by piercing of external electric waves, the structure is provided in the section between the integrated circuit of a circuit board and a housing with a plurality of electrically conductive areas formed of electrically conductive material, in order that the electrically conductive areas form a function of grounding to scatter the electric waves.

2. Description of the Prior Art

As shown in FIG. 1 which is a structural sectional view of a conventional card reader, wherein the whole card reader A includes a circuit board A2 in a housing A1 as a principal unit, The circuit board A2 is provided with a circuit connector A21 in order that the circuit connector A21 can be connected with a main circuit of an electric equipment (not shown) to form connecting of the card reader A with the main circuit, and to supply power for operation of the card reader A. The circuit board A2 is provided on the front surface thereof with an insertion slot A22 for insertion of a memory card; and an integrated circuit A23 is connected between the insertion slot A22 and the circuit connector A21 to control operation of the entire card reader A, and further to form the connection between the memory card and the main circuit.

When a normal card reader A is operated in cooperation with the connection between the main circuit and the memory card circuit, an electromagnetic effect will be induced by communicating of the electric current among the electric elements on the circuit board A2 of the card reader A; the electromagnetic effect will interfere with the normal operation of the circuit to influence the effect of operation of the entire circuit. Therefore, the structural design for the card reader A and the arrangement of the circuit thereof must be provided with a basic EMI preventing function in order to avoid the circuit in the memory card from interference of electric waves to influence accessing of data.

And more, for the convenience of insertion and drawing out for changing of the memory card, mostly a card reader has its insertion slot A22 allocated on the front surface of the housing A1, this surface also is provided with an opening A11 for passing of the memory card, thereby, the memory card can enter the card reader A to be fittingly inserted in the insertion slot A22. However, the opening A11 will also become an area losing the shielding of the housing A1, and is subjected to direct incidence of electric waves onto the circuit board A2 in the housing A1 through the opening A11 from the outside, and the electric waves will extend through the integrated circuit A23 to make it damaged and destroyed.

SUMMARY OF THE INVENTION

The grounding structure of a card reader of the present invention is provided in the section between the integrated circuit of a circuit board and a housing with a plurality of electrically conductive areas formed of electrically conductive material, the electrically conductive areas are connected with the grounding line of the circuit board in order that when the front surface of the housing of the card reader is subjected to an electric shock, the electrically conductive areas form a function of grounding to scatter the electric waves and to avoid the integrated circuit of the card reader from damage by piercing of external electric waves.

And the electrically conductive areas can be arranged at the position where the insertion slot is located on the circuit board, by the electromagnetic shielding action formed by the electrically conductive areas at the area of the insertion slot, the memory card in the insertion slot can further be subjected to an effect of EMI prevention.

The present invention will be apparent in its structural combination and the entire mode of operation thereof after reading the detailed description of the preferred embodiment thereof in reference to the accompanying drawings.

DETAILED DESCRIPTION OF THE PREFERRED EMBODIMENT

Figure 1:
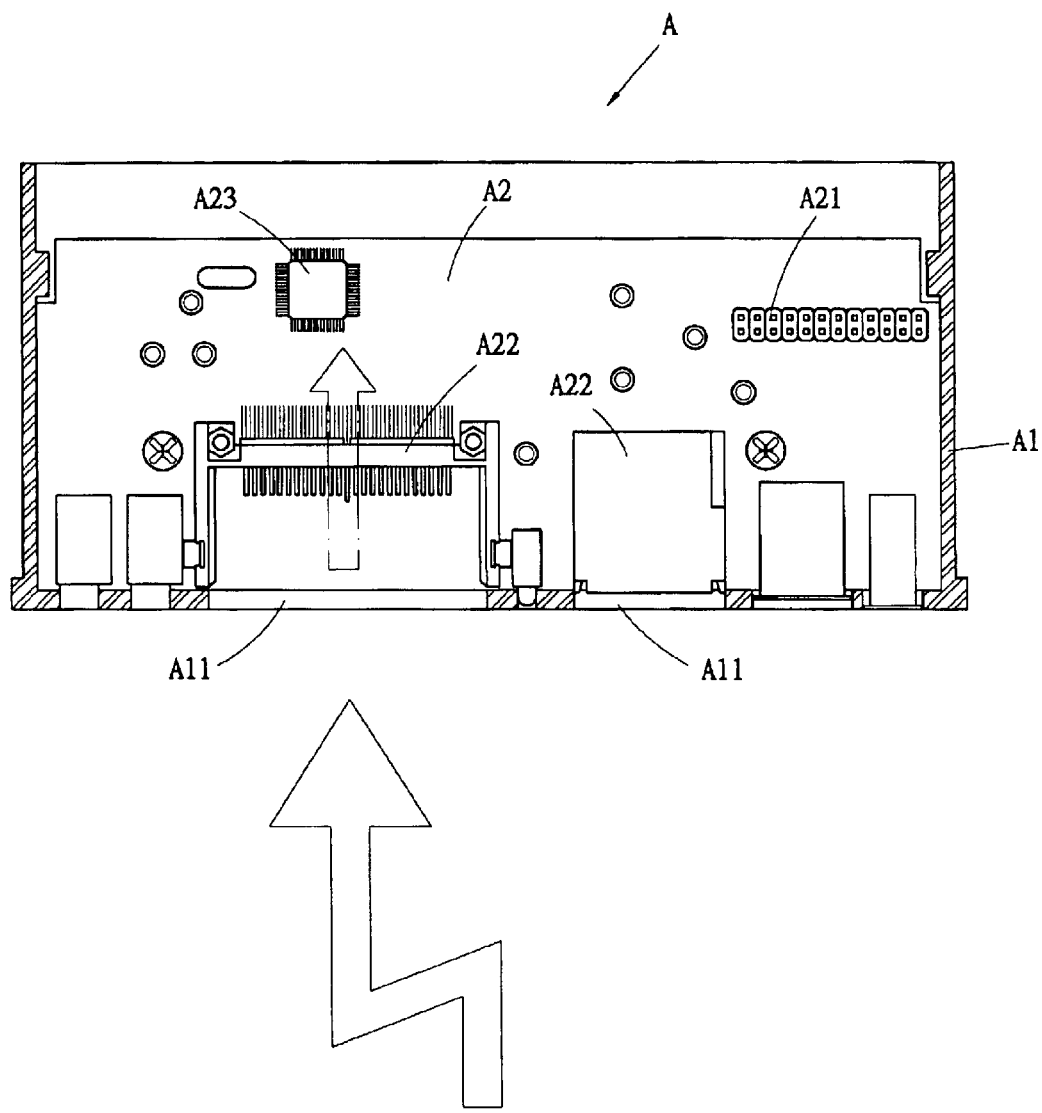
FIG. 1 is a sectional view showing the structure of a normal card reader.
Figure 2:
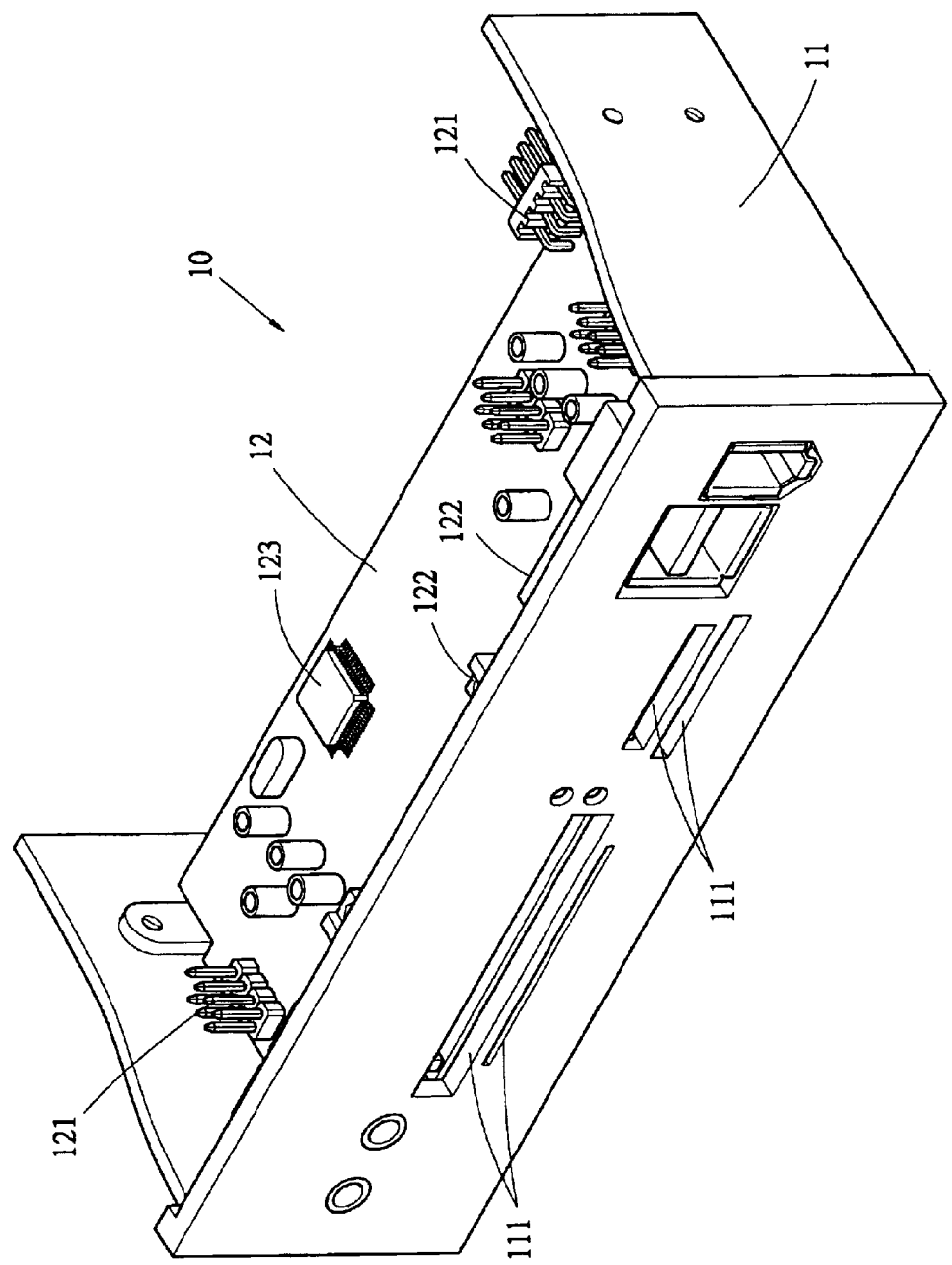
FIG. 2 is a perspective schematic view showing the apparent structure of the card reader of the present invention.
Figure 3:
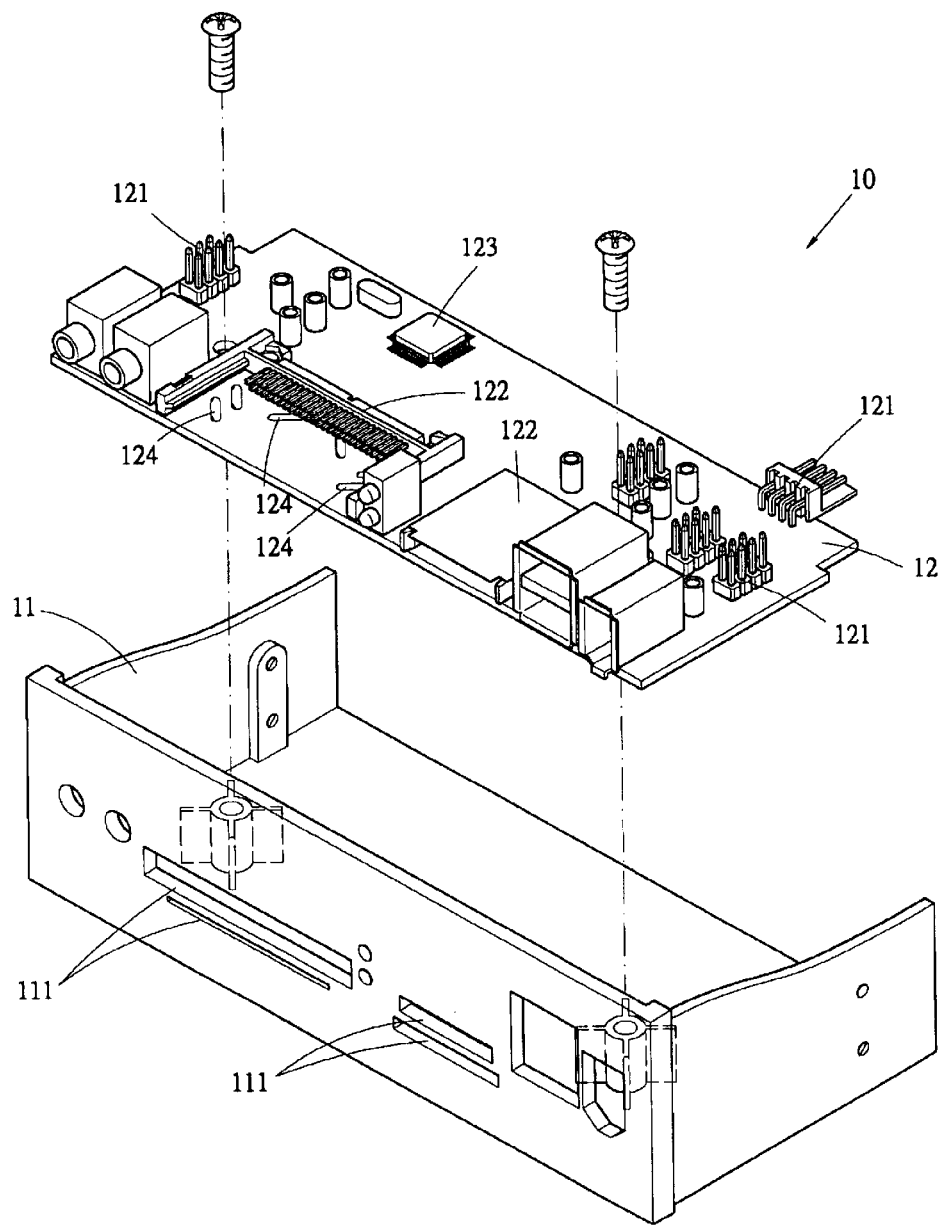
FIG. 3 is a perspective schematic view showing the structure of the card reader of the present invention.

In the grounding structure of a card reader of the present invention, the structure of the card reader is also comprised, as shown in FIGS. 2 and 3, of a circuit board 12 in a housing 11 as a principal unit; the circuit board 12 is provided with a circuit connector 121 to be connected with a main circuit of an electric equipment (not shown) to form connecting of the card reader 10 with the main circuit, and to supply power for the operation of the card reader 10. The circuit board 12 is provided on the front surface thereof with an insertion slot 122 for insertion of a memory card; and an integrated circuit 123 is connected between the insertion slot 122 and the circuit connector 121 to control the operation of the entire card reader 10, and further to form the connection between the memory card and the main circuit.

The front surface of the housing 11 is provided with an opening 111 for passing of the memory card, thereby, the memory card can enter the card reader 10 to be fittingly inserted in the insertion slot 122 for the convenience of insertion and drawing out for changing of the memory card.

The focal point of the present invention is that, the structure is provided in the section between the integrated circuit 123 and the housing 11 with a plurality of electrically conductive areas 124 formed of electrically conductive material. The electrically conductive areas 124 are formed from solder directly welded on the circuit board 12, and are preferably arranged at the position where the insertion slot 122 is located on the circuit board 12, and the electrically conductive areas 124 are connected with the grounding line of the circuit board 12.

Figure 4:
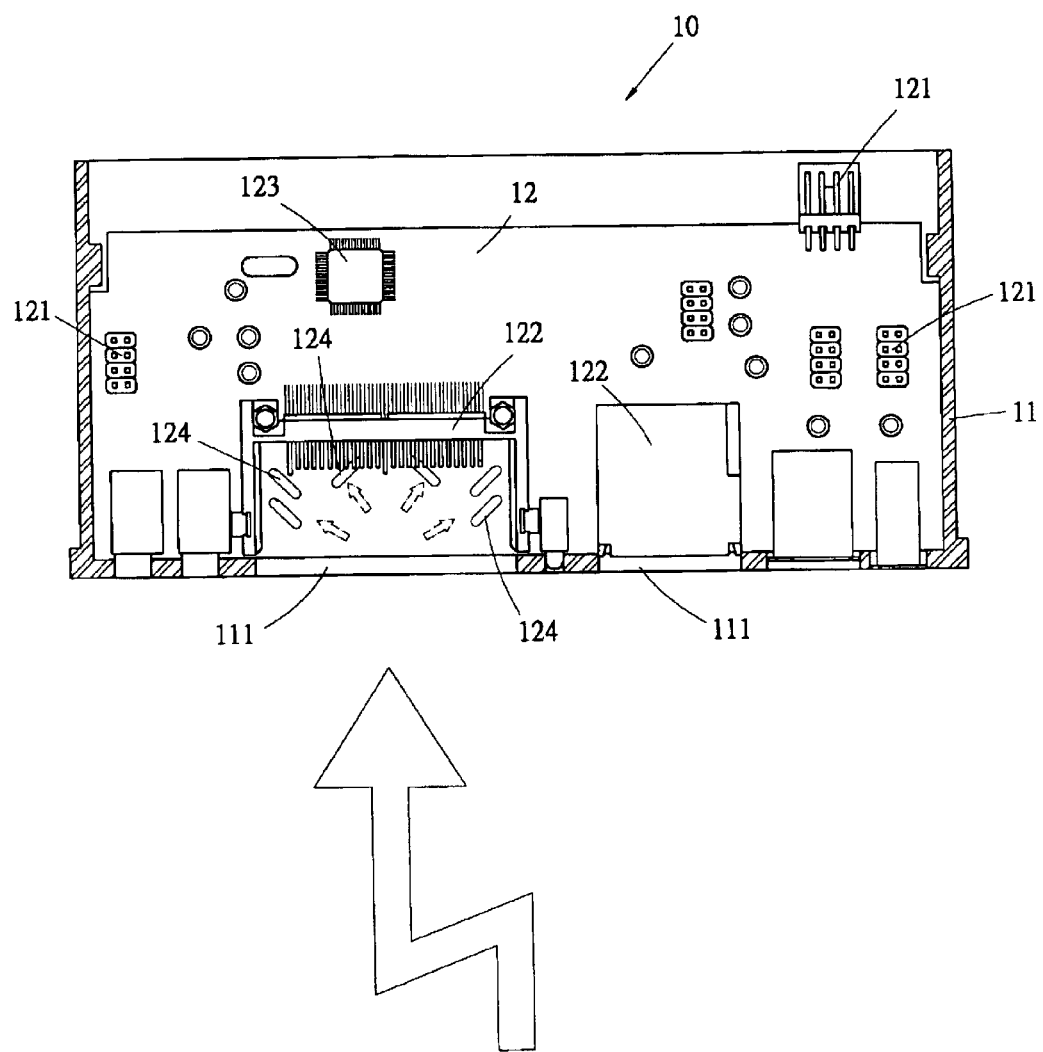
FIG. 4 is a sectional view showing the structure of the card reader of the present invention.

As shown in FIG. 4, when the front surface of the housing 11 of the card reader 10 is subjected to an electric shock, the electrically conductive areas 124 form a function of grounding to scatter the electric waves and to avoid the integrated circuit 123 from damage by piercing of external electric waves. Especially, by an electromagnetic shielding action formed by the electrically conductive areas 124 at the area of the insertion slot 122, the memory card in the insertion slot 122 can further be subjected to an effect of EMI prevention.

The grounding structure of a card reader of the present invention is provided in the section between the integrated circuit and the housing with a plurality of electrically conductive areas formed of electrically conductive material, thereby, the electrically conductive areas form a function of grounding to scatter the electric waves, so that the card reader can effectively avoid the integrated circuit from damaging and destroying the structure by piercing of external electric waves.

The description and drawings are only for illustrating a preferred embodiment of the present invention, and not for giving any limitation to the scope of the present invention. It will be apparent to those skilled in this art that various modifications or changes without departing from the spirit, scope and characteristic of this invention shall also fall within the scope of the appended claims of the present invention.

What is claimed is:

1. A grounding structure of a card reader, wherein said card reader includes a circuit board in a housing as a principal unit, said circuit board is provided with a circuit connector to be connected with a main circuit of an electric equipment; said circuit board is provided on the front surface thereof at least with an insertion slot for insertion of a memory card; and an integrated circuit is connected between said insertion slot and said circuit connector to control the operation of said card reader and further to form the connection between said memory card and said main circuit; and wherein:

a surface of said circuit board within said insertion slot extending between said integrated circuit and a front of said housing includes a plurality of grounded electrically conductive areas formed of electrically conductive material; whereby said electrically conductive areas provide a ground path for static entering said housing through said insertion slot in order that when the front surface of said housing of said card reader is subjected to an electric shock, said electrically conductive areas provide a ground path for the electric shock in order to prevent the integrated circuit from being damaged or destroyed, and wherein the electrically conductive areas are further arranged to shield the integrated circuit from electromagnetic radiation that has penetrated the opening.

2. The grounding structure of a card reader as in claim 1, wherein said electrical conductive areas are formed from solder directly welded on said circuit board.

* * * * *